(12) United States Patent
Yun et al.

(10) Patent No.: US 11,770,115 B2
(45) Date of Patent: Sep. 26, 2023

(54) TUNABLE CIRCUIT INCLUDING INTEGRATED FILTER CIRCUIT COUPLED TO VARIABLE CAPACITANCE, AND RELATED INTEGRATED CIRCUIT (IC) PACKAGES AND FABRICATION METHODS

(71) Applicant: QUALCOMM Incorporated, San Diego, CA (US)

(72) Inventors: Changhan Hobie Yun, San Diego, CA (US); Hannu Laurila, Oulu (FI); Ville Lehtisalo, Uusimaa (FI); Ville Herman Brunou, Helsinki (FI); Daniel Daeik Kim, San Diego, CA (US); Paragkumar Ajaybhai Thadesar, San Diego, CA (US); Nosun Park, Incheon (KR); Wei Cheng, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 217 days.

(21) Appl. No.: 17/235,131

(22) Filed: Apr. 20, 2021

(65) Prior Publication Data

US 2022/0123735 A1 Apr. 21, 2022

Related U.S. Application Data

(60) Provisional application No. 63/092,920, filed on Oct. 16, 2020.

(51) Int. Cl.
*H03J 3/20* (2006.01)
*H03H 3/00* (2006.01)
(Continued)

(52) U.S. Cl.
CPC .................. *H03J 3/20* (2013.01); *H03H 3/00* (2013.01); *H03H 7/0123* (2013.01); *H04B 1/18* (2013.01)

(58) Field of Classification Search
CPC ............ H03J 3/20; H03J 3/26; H03J 2200/10; H03H 3/00; H03H 7/0123; H03H 1/00;
(Continued)

(56) References Cited

U.S. PATENT DOCUMENTS 8,422,972 B2 * 4/2013 Furutani .................. H04B 1/48
455/269
9,813,043 B2 11/2017 Zuo et al.
(Continued)

FOREIGN PATENT DOCUMENTS

JP H09238025 A * 9/1997
JP 2004364139 A * 12/2004
(Continued)

OTHER PUBLICATIONS

International Search Report and Written Opinion for International Patent Application No. PCT/US2021/051316, dated Jan. 12, 2022, 13 pages.

*Primary Examiner* — Lana N Le
(74) *Attorney, Agent, or Firm* — Withrow & Terranova, PLLC

(57) ABSTRACT

An exemplary tunable circuit includes an inductor coupled to a node and a first capacitor coupled to the node. The tunable circuit also includes a variable capacitor coupled to the node, such that a total capacitance of the tunable circuit depends on a fixed capacitance of the first capacitor and a variable capacitance of the variable capacitor. In an example, the inductor and the first capacitor are both included in a passive device and the variable capacitor is in a semiconductor device. The variable capacitor allows the total capacitance to be modified for the purpose of, for example, calibrating the capacitance to account for manufacturing variations, and/or adjusting to a frequency range of operation used by wireless devices in a region of the world.

(Continued)

The first capacitor may be a higher quality capacitor providing a larger portion of the total capacitance than the variable capacitor.

18 Claims, 13 Drawing Sheets

(51) Int. Cl.
    *H04B 1/18*     (2006.01)
    *H03H 7/01*     (2006.01)

(58) Field of Classification Search
    CPC .. H03H 7/0115; H03H 7/0153; H03H 7/1758; H03H 7/1766; H03H 9/542; H03H 2210/025; H03H 7/1741; H03H 9/1071; H04B 1/18; H04B 1/40; H04B 1/08; H01L 2223/6677; H01L 23/64; H01L 23/66; H01L 25/16; H01L 23/49816; H01L 23/49822; H01L 23/642; H01L 23/645; H01L 23/49827; H01L 23/5227; H01L 28/10; H01L 23/5223; H01L 2924/19; H01L 23/5384; H01L 2224/131; H01L 21/486; H01L 21/4857; H01L 23/3121; H01L 24/32; H01L 2224/05025; H01L 2224/32245; H03F 2200/243; H03F 2200/246; H03F 2200/294; H03F 2200/451; H03F 1/565; H03F 3/195
    See application file for complete search history.

(56) References Cited

U.S. PATENT DOCUMENTS

| | | | |
|---|---|---|---|
| 2017/0077079 A1* | 3/2017 | Lan | H01L 23/5223 |
| 2020/0358461 A1* | 11/2020 | Jussila | H04B 1/1036 |
| 2021/0074682 A1* | 3/2021 | Chen | H01L 21/563 |
| 2021/0281234 A1* | 9/2021 | Kim | H01L 28/60 |
| 2021/0313285 A1* | 10/2021 | Noori | H03F 1/565 |
| 2021/0375856 A1* | 12/2021 | Alcorn | H01L 25/16 |

FOREIGN PATENT DOCUMENTS

| | | |
|---|---|---|
| JP | 2014093752 A * | 5/2014 |
| WO | 2019092403 A1 | 5/2019 |

* cited by examiner

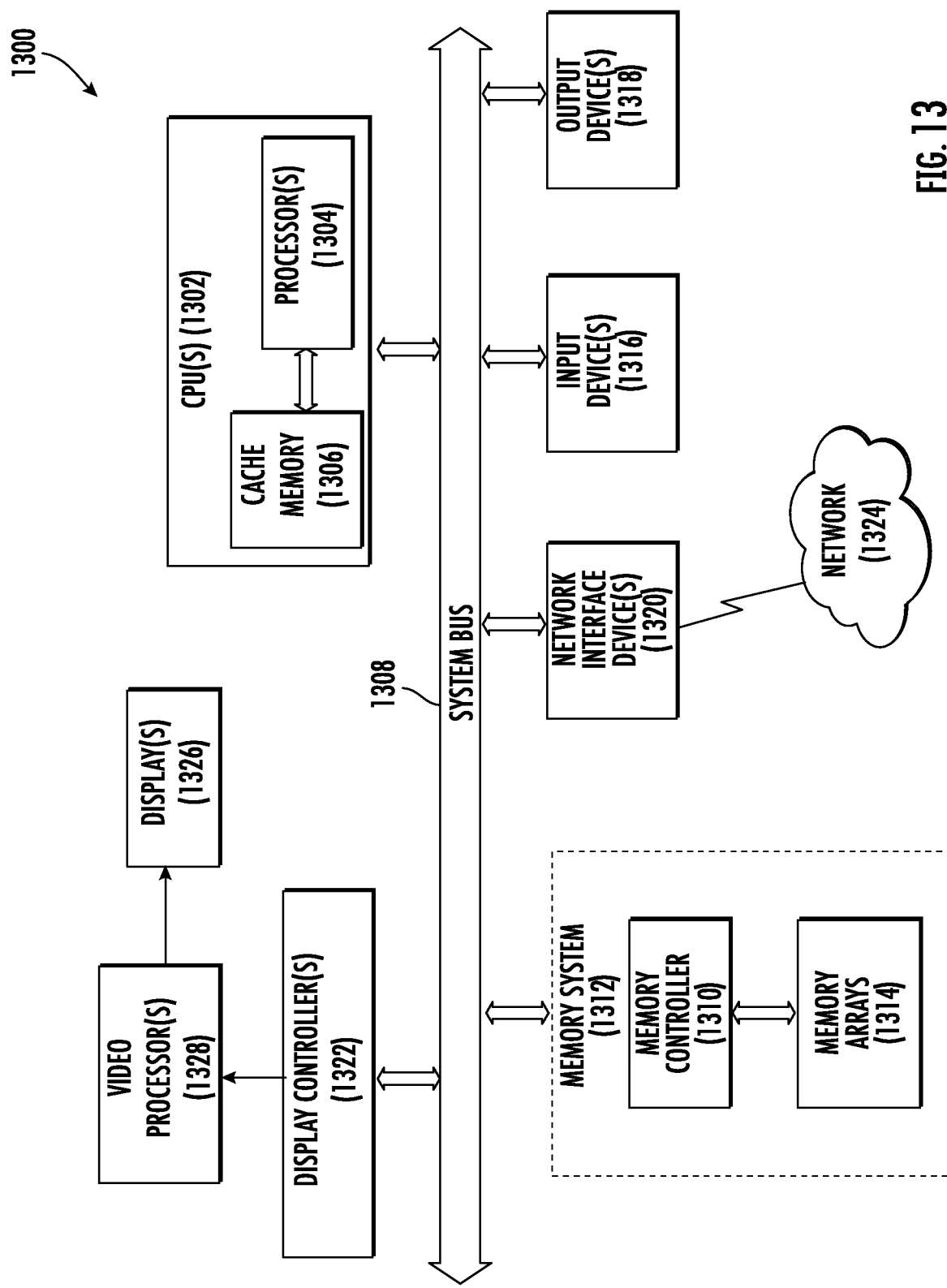

TUNABLE CIRCUIT INCLUDING INTEGRATED FILTER CIRCUIT COUPLED TO VARIABLE CAPACITANCE, AND RELATED INTEGRATED CIRCUIT (IC) PACKAGES AND FABRICATION METHODS

PRIORITY APPLICATION

The present application claims priority under 35 U.S.C. § 119(e) to U.S. Provisional Patent Application Ser. No. 63/092,920, filed Oct. 16, 2020 and entitled "TUNABLE CIRCUIT INCLUDING INTEGRATED FILTER CIRCUIT COUPLED TO VARIABLE CAPACITANCE, AND RELATED INTEGRATED CIRCUIT (IC) PACKAGES AND FABRICATION METHODS," which is incorporated herein by reference in its entirety.

BACKGROUND

I. Field of the Disclosure

The field of the disclosure relates generally to tunable circuits, and particularly to tunable circuits for radio-frequency (RF) signal processing in integrated circuits.

II. Background

The wireless communication industry provides wireless communication services around the world but the circumstances for providing such capabilities vary from region to region. Some frequency bands, or ranges of frequencies, for cellular communications, for example, are universally reserved, but other frequencies may be utilized differently according to the region. Wireless receivers include tunable circuits that are designed to exclude or filter out signals that are received in certain frequencies to avoid interference with the desired signals. Tunable receiver circuits are designed to have transmission zeros at which signals at a particular frequency are filtered out. These zeros can be used to limit reception and processing of signals at frequencies on the upper and lower ends of preferred range. One example of a circuit for filtering signals of a particular frequency is an LC circuit, also known as a resonator circuit. An LC circuit includes an inductor and a capacitor that are connected in series or in parallel to each other. LC circuits have a resonant frequency depending on an inductance (L) of the inductor and a capacitance (C) of the capacitor. Tunable circuits that are able to adjust the resonant frequency allow a wireless device to adjust a received frequency range and allow for calibration that may be necessary due to manufacturing variations of the inductor and capacitor. The quality of signal transmission in an LC circuit depends on a Q value of the inductors and capacitors, where a lower Q indicates more signal loss. There is a need to manufacture tunable circuits having high Q inductors and capacitors in a cost effective manner for use in wireless devices.

SUMMARY OF THE DISCLOSURE

Aspects disclosed in the detailed description include a tunable circuit including an integrated filter circuit coupled to variable capacitance. Related integrated circuit (IC) packages and fabrication methods are also disclosed. Tunable circuits in wireless communication devices can be tuned to filter a specific frequency or frequency band from a received signal. A tuned frequency depends on a capacitance and an inductance in the tunable circuit. An exemplary tunable circuit disclosed herein includes an inductor coupled to a node and a first capacitor coupled to a common node. The tunable circuit also includes a variable capacitor coupled to the common node, such that a total capacitance of the tunable circuit depends on a fixed capacitance of the first capacitor and a variable capacitance of the variable capacitor. In an example, the inductor and the first capacitor are both included in a passive device and the variable capacitor is in a semiconductor device. The variable capacitor allows the total capacitance to be modified for the purpose of, for example, calibrating the capacitance to account for manufacturing variations, and/or adjusting to a frequency range of operation used by wireless devices in a region of the world. In one example, the first capacitor is a high quality (high Q) capacitor providing a larger portion of a desired total capacitance and the variable capacitor provides a smaller portion of the total capacitance.

In an exemplary aspect, a tunable circuit is disclosed. The tunable circuit includes an inductor comprising a first terminal and a second terminal, the first terminal coupled to a node. The tunable circuit also includes a first capacitor comprising a third terminal and a fourth terminal, the third terminal coupled to the node, and a variable capacitor comprising a fifth terminal and a sixth terminal, the fifth terminal coupled to the node.

In another exemplary aspect, a tunable circuit including a first acoustic resonator and a variable circuit is disclosed. The first acoustic resonator comprises a first terminal and a second terminal with the second terminal coupled to a first node configured to receive an input signal. The variable capacitor comprises a third terminal coupled to the first terminal and a fourth terminal coupled to the second terminal.

In another exemplary aspect, a tunable circuit package is disclosed. The tunable circuit package includes a package substrate, a passive device, and a semiconductor device. The passive device is coupled to the package substrate, and the passive device comprises an inductor comprising a first terminal and a second terminal, the first terminal coupled to a node, and a first capacitor comprising a third terminal and a fourth terminal, the third terminal coupled to the node. The semiconductor device is coupled to the package substrate, and the semiconductor device comprises a variable capacitor comprising a fifth terminal and a sixth terminal, the fifth terminal coupled to the node.

In another exemplary aspect, a method of manufacturing a circuit package is disclosed. The method comprises forming a package substrate and forming a passive device comprising an inductor and a first capacitor, the inductor comprising a first terminal and a second terminal, the first terminal coupled to a node, and the first capacitor comprising a third terminal and a fourth terminal, the third terminal coupled to the node. The method further comprises forming a semiconductor device comprising a variable capacitor comprising a fifth terminal and a sixth terminal, coupling the passive device to the package substrate, and coupling the semiconductor device to the package substrate to couple the fifth terminal to the node.

BRIEF DESCRIPTION OF THE FIGURES

FIG. 13 is a block diagram of an exemplary tunable circuit including an inductor, a first capacitor, and a variable capacitor with the first capacitor and the variable capacitor coupled in parallel as shown in FIGS. 3-11, and according to any of the aspects disclosed herein.

DETAILED DESCRIPTION

Figure 1:
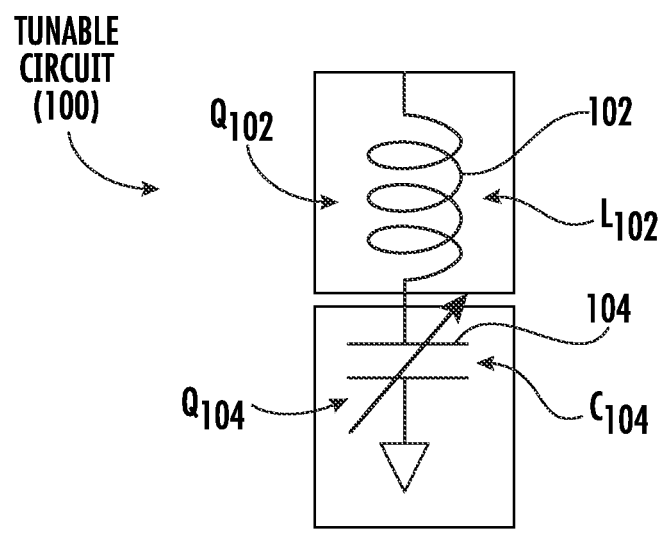
FIG. 1 is a schematic diagram of a conventional tunable circuit including an inductor and a variable capacitor.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed in the detailed description include a tunable circuit including an integrated filter circuit coupled to variable capacitance. Related integrated circuit (IC) packages and fabrication methods are also disclosed. Tunable circuits in wireless communication devices can be tuned to filter a specific frequency or frequency band from a received signal. A tuned frequency depends on a capacitance and an inductance in the tunable circuit. An exemplary tunable circuit disclosed herein includes an inductor coupled to a node and a first capacitor coupled to a common node. The tunable circuit also includes a variable capacitor coupled to the common node, such that a total capacitance of the tunable circuit depends on a fixed capacitance of the first capacitor and a variable capacitance of the variable capacitor. In an example, the inductor and the first capacitor are both included in a passive device and the variable capacitor is in a semiconductor device. The variable capacitor allows the total capacitance to be modified for the purpose of, for example, calibrating the capacitance to account for manufacturing variations, and/or adjusting to a frequency range of operation used by wireless devices in a region of the world. In one example, the first capacitor is a high quality (high Q) capacitor providing a larger portion of a desired total capacitance and the variable capacitor provides a smaller portion of the total capacitance.

Tunable circuits are used to manipulate analog signals at certain frequencies or ranges of frequencies. In a mobile communications device, an antenna receives radio frequency (RF) signals in a wide range of frequencies, but only the signals within frequency bands used for communication are of interest. Signals that are received in frequencies outside the upper or lower end of a desired band are essentially noise that need to be excluded from the signal to be processed. An inductor-capacitor (LC) resonator circuit, also referred to interchangeably herein as an LC tank circuit, is a tunable circuit that creates a zero at a particular frequency in the transfer function of a circuit. In other words, an input signal at the frequency of the zero will not be transferred to an output signal while signals of desired frequencies are transferred to the output for processing. Herein, a tank or resonator circuit having a zero at a particular frequency is said to be tuned to such frequency.

Frequency bands employed for wireless communication (e.g., voice and data) are established by each country and vary to some degree among the different regions of the world. To make a wireless communication device that will function in each region, the RF circuits must be versatile. Thus, the frequencies at which zeros should be provided in a tunable circuit will vary. In addition, there is variability in component manufacturing that can result in variations of the frequency to which a circuit is tuned. For both of these reasons, it is desirable to manufacture LC resonator circuits that can be calibrated or tuned to a desired frequency. An LC resonator circuit can be tuned by varying the capacitance of the capacitor while keeping the inductance value the same.

FIG. 1 is a schematic diagram of a tunable circuit 100 in a conventional configuration including an inductor 102 in series with a variable capacitor 104. The inductance $L_{102}$ of the inductor 102 is fixed but the capacitance $C_{104}$ of the variable capacitor 104 is adjustable to enable the tunable circuit 100 to be tuned to a desired frequency. The variable capacitor 104 can be, for example, a varactor or a discrete variable capacitor, each of which is manufactured in a semiconductor device. For the purposes of calibration and/or adjusting to frequency bands of a geographic region, the variable capacitor 104 needs to be adjustable (i.e., increased or decreased) in a range of up to 100% c of the capacitance $C_{104}$.

RF circuits for wireless communication devices are manufactured with inductors and capacitors having a high Q factor for improved performance and lower signal losses. A Q factor is a dimensionless quality factor that is measured differently in inductors and capacitors but in general measures a ratio of energy stored in a device to the energy lost through thermal heating (e.g., due to resistance), which is determined by the materials and construction of the component. The Q factor $Q_{102}$ of the inductor 102 and the Q factor $Q_{104}$ of the variable capacitor 104 both contribute to the efficiency and performance of the tunable circuit 100.

Figure 2:
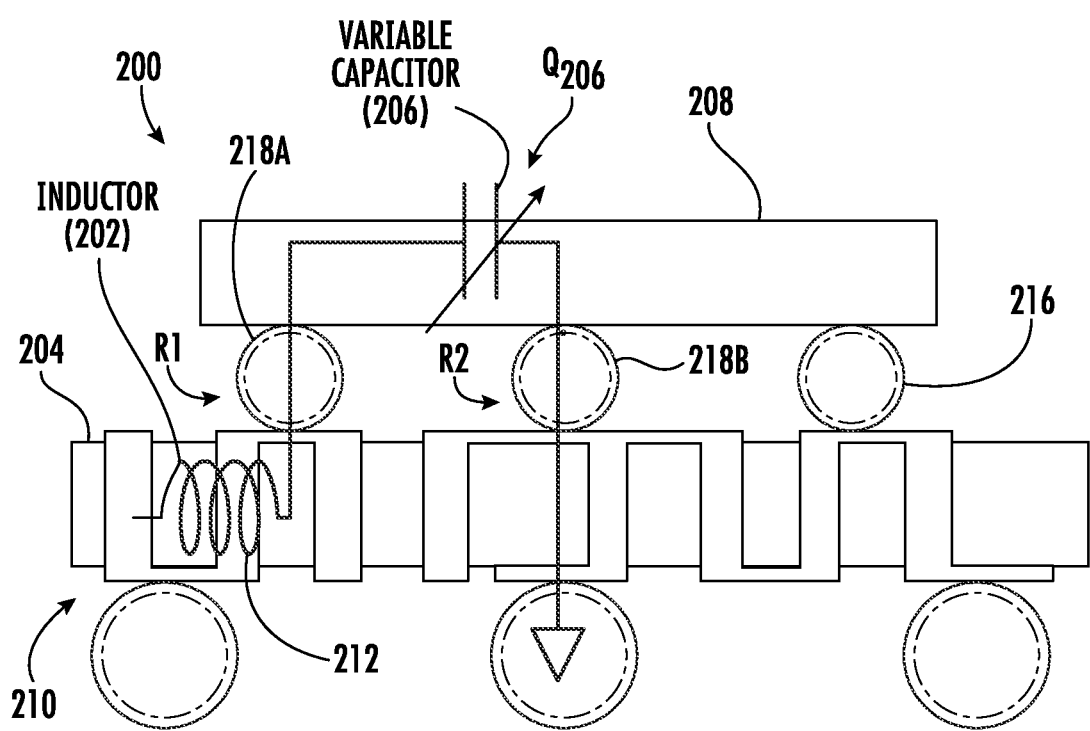
FIG. 2 is a cross-sectional side view of an integrated circuit (IC) package including the tunable circuit of FIG. 1.

FIG. 2 is a cross-sectional side view of an integrated circuit (IC) package 200 for including the conventional tunable circuit 100 of FIG. 1. The IC package 200 includes an inductor 202 formed in the inductor device 204 and a variable capacitor 206 formed in the semiconductor device 208. The inductor 202 can be implemented with a high Q factor 210 in the inductor device 204. In this regard, the inductor device 204 may be, for example, a passive-on-glass (POG) device in which conductive elements (e.g., coils) 212 forming the inductor 202 are made of a highly conductive material, such as thick copper.

The variable capacitor 206 is formed separate from the inductor device 204 in the semiconductor device 208. The variable capacitor 206 includes resistance associated with connections to the inductor device 204 and also internal resistance associated with being formed in a semiconductor device 208. For example, the inductor 202 is coupled to the variable capacitor 206 through device-to-device connectors 216, which include solder ball 218A in this example. The variable capacitor 206 is coupled back to the inductor device 204 by solder ball 218B. In addition to resistances R1 and R2 of the solder balls 218A and 218B, there is resistance internal to the semiconductor device 208. The variable capacitor 206 is formed by thin metal (e.g., aluminum) layers or plates (not shown) and thin internal routing traces (not shown). Thus, quality of the tunable circuit 100 in the IC package 200 suffers from a Q factor $Q_{206}$ of the variable capacitor 206 formed in the semiconductor device 208.

Forming the variable capacitor 206 in the semiconductor device 208 also increases a cost of the semiconductor device 208, which will typically also include other circuits. A total maximum capacitance of the variable capacitor 206 may occupy a large area (e.g., 3 millimeters (mm)×3 mm) of a semiconductor device 208. The cost of the semiconductor device 208, and therefore a cost of the IC package 200, is partially due to area occupied by the variable capacitor 206.

Figure 3:
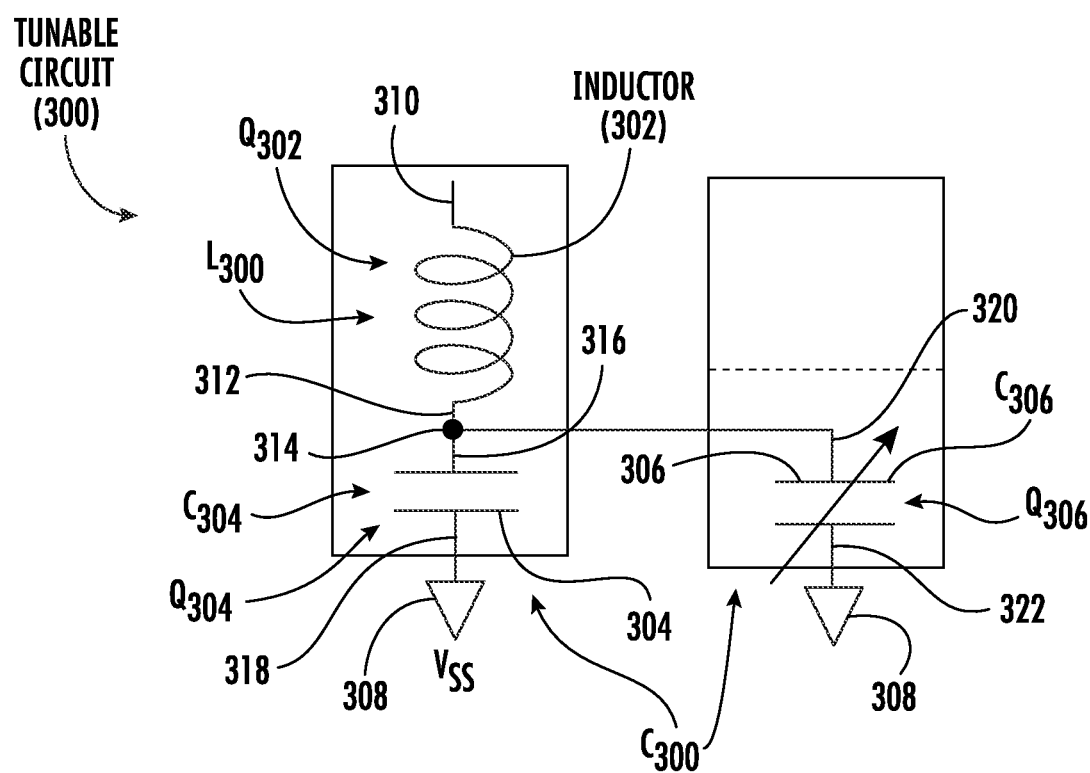
FIG. 3 is a schematic diagram of an exemplary tunable circuit including an inductor, a first capacitor, and a variable capacitor coupled to a first node in an LC circuit with the first capacitor and the variable capacitor coupled in parallel.

FIG. 3 is a schematic diagram of an exemplary tunable circuit 300 that is similar in operation to the IC package 200 in FIG. 2 and includes an inductor 302 coupled in series to a first capacitor 304 and a variable capacitor 306, with the first capacitor 304 and the variable capacitor 306 coupled in parallel to a ground node 308 at a ground voltage $V_{SS}$. The tunable circuit 300 may be referred to as a shunt circuit, a tank circuit, a resonant circuit, or an LC circuit. The tunable circuit 300 filters or blocks a target frequency or range of frequencies in an RF signal supplied to the tunable circuit 300. In other words, the tunable circuit 300 can be tuned to create a transmission zero at a particular frequency, separating out a signal of a resonant frequency from a received signal that includes a range of frequencies.

Specifically, the inductor 302 includes terminals 310 and 312, with the terminal 312 coupled to a node 314. The first capacitor 304 includes terminals 316 and 318, with the terminal 316 coupled to the node 314. The variable capacitor 306 includes terminals 320 and 322 with the terminal 320 coupled to the node 314. In addition, the terminal 318 of the first capacitor 304 and the terminal 322 of the variable capacitor 306 are both coupled to the ground node 308. Thus, the first capacitor 304 and the variable capacitor 306 are coupled in parallel to each other to provide a total capacitance $C_{300}$.

The tunable circuit 300 is tuned to a resonant frequency based on a total inductance $L_{300}$ and the total capacitance $C_{300}$. The total inductance $L_{300}$ is provided by the inductor 302. Since the first capacitor 304 and the variable capacitor 306 are coupled in parallel between the node 314 and the ground node 308, the total capacitance $C_{300}$ is provided by a fixed capacitance $C_{304}$ of the first capacitor 304 plus a variable capacitance $C_{306}$ of the variable capacitor 306. Performance and efficiency of the tunable circuit 300 are determined by a combination of a Q factor $Q_{302}$ of the inductor 302, a Q factor $Q_{304}$ of the first capacitor 304, and a Q factor $Q_{306}$ of the variable capacitor 306. A Q factor of a capacitor at a frequency is determined by the equation:

$$Q=1/(\omega CR), \text{ where:}$$

$\omega$=frequency;
C=total capacitance; and
R=resistance.

Since the first capacitor 304 and the variable capacitor 306 each contribute to a Q factor of the total capacitance $C_{300}$, the relative impacts of the Q factor $Q_{302}$ and the Q factor $Q_{304}$ correspond to a relationship between the fixed capacitance $C_{304}$ and the variable capacitance $C_{306}$. For example, if the fixed capacitance $C_{304}$ of the first capacitor 304 is much larger than the variable capacitance $C_{306}$ of the variable capacitor 306, then the Q factor $Q_{302}$ will have a much greater impact than the Q factor $Q_{304}$ on the total Q factor of capacitance in the tunable circuit 300.

Figure 4:
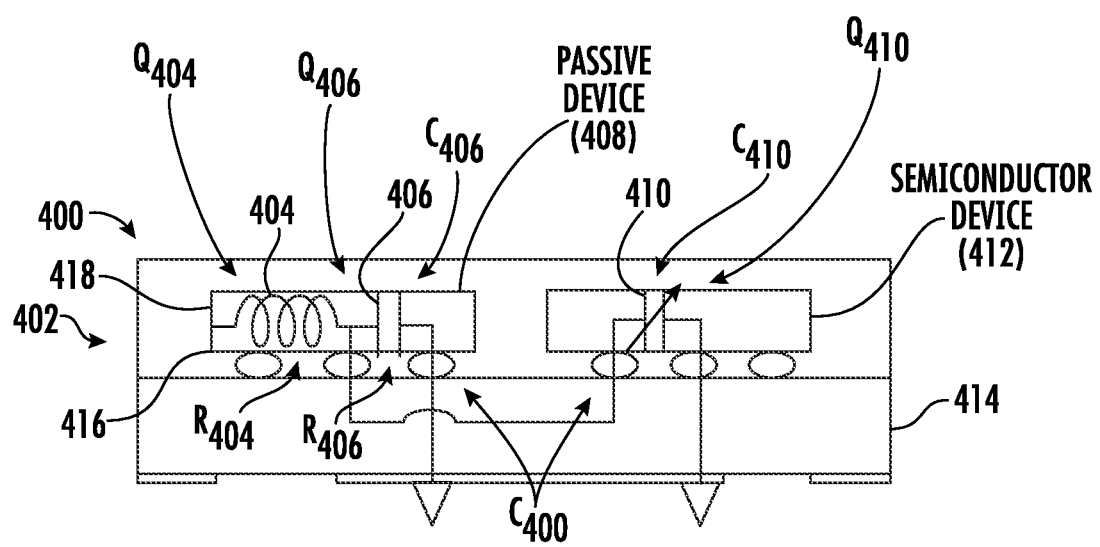
FIG. 4 is a schematic diagram of the exemplary tunable circuit in FIG. 3 in which the inductor and the first capacitor are in a passive-on-glass (POG) device coupled to a package substrate and the variable capacitor is in a semiconductor device coupled to the package substrate.

FIG. 4 is a schematic diagram illustrating an exemplary tunable circuit package 400 including a tunable circuit 402 that may be the tunable circuit 300 in FIG. 3. The tunable circuit package 400 has improved performance and lower cost than the IC package 200 in FIG. 2 because an inductor 404 and a first capacitor 406 of the tunable circuit 402 are manufactured with high Q factors $Q_{404}$ and $Q_{406}$, respectively, in a passive device 408. A variable capacitor 410 of the tunable circuit 402 is implemented in a semiconductor device 412. The tunable circuit package 400 includes a package substrate 414. The passive device 408 and the semiconductor device 412 are coupled to the package substrate 414 and coupled to each other through the package substrate 414.

The first capacitor 406 can be implemented in the passive device 408 because the first capacitor 406 has a fixed capacitance $C_{406}$, which means that the first capacitor 406 is not a variable capacitor. In this regard, the first capacitor 406 can be manufactured with a high Q factor in the passive device 408. For example, the passive device 408 may be a POG device 416 in which the inductor 404 and the first capacitor 406 may be formed of conductive elements, such as metal layers and through-glass-vias (TGVs) formed of highly conductive materials, such as thick copper or other conductive metal. The POG device 416 includes a glass substrate 418. Using highly conductive materials reduces the resistances $R_{404}$ and $R_{406}$ of the inductor 404 and the first capacitor 406. Lower resistance increases efficiency and performance, which is indicated by the high Q factors $Q_{404}$ and $Q_{406}$.

The tunable circuit 400 must be tunable (e.g., to achieve a transmission zero or resonance) to a desired frequency. The tunable circuit 402 includes the variable capacitor 410 to provide the tunability. The variable capacitor 410 may be sized to provide a range of the variable capacitance $C_{410}$ that is added to the fixed capacitance $C_{406}$ of the first capacitor (i.e., $C_{400}=C_{406}+C_{410}$). In other words, the total capacitance $C_{400}$ can be set in a range from a minimum equal to the fixed capacitance $C_{406}$ of the first capacitor 406, when the variable capacitor 410 is set to have zero capacitance, up to a maximum determined by the fixed capacitance $C_{406}$ of the first capacitor 406 plus a maximum of the variable capacitance $C_{410}$ from the variable capacitor 410. In an example, the maximum of the variable capacitance $C_{410}$ may be in a range of more than 100% to less than 10% of the fixed capacitance $C_{406}$ of the first capacitor 406. For example, the fixed capacitance $C_{406}$ of the first capacitor 406 can be 2.5 picofarads (pF) while the variable capacitance $C_{410}$ of the variable capacitor 410 is 0.2 pF. In the case in which the variable capacitance $C_{410}$ is less than 10% of the total capacitance $C_{400}$, the Q factor $Q_{410}$ of the variable capacitor 410 has a much smaller effect on the total performance and losses of the tunable circuit 402 than the first capacitor 406. In this manner, the performance and power efficiency of the tunable circuit 402 is increased. In another aspect, the variable capacitor 410 can be made much smaller than the variable capacitor 206 in FIG. 2, saving area on the semiconductor device 412.

In one example, the variable capacitor 410 may be varactor in which a special dielectric material provides a variable capacitance depending on a bias voltage. In another example, the variable capacitor 410 may be a bank of switched capacitors (not shown) coupled in parallel to each other. The switched capacitors can be configured to select one of a number of discrete capacitances based on which capacitors are coupled to the tunable circuit package 400 by closed switches.

Figure 5:
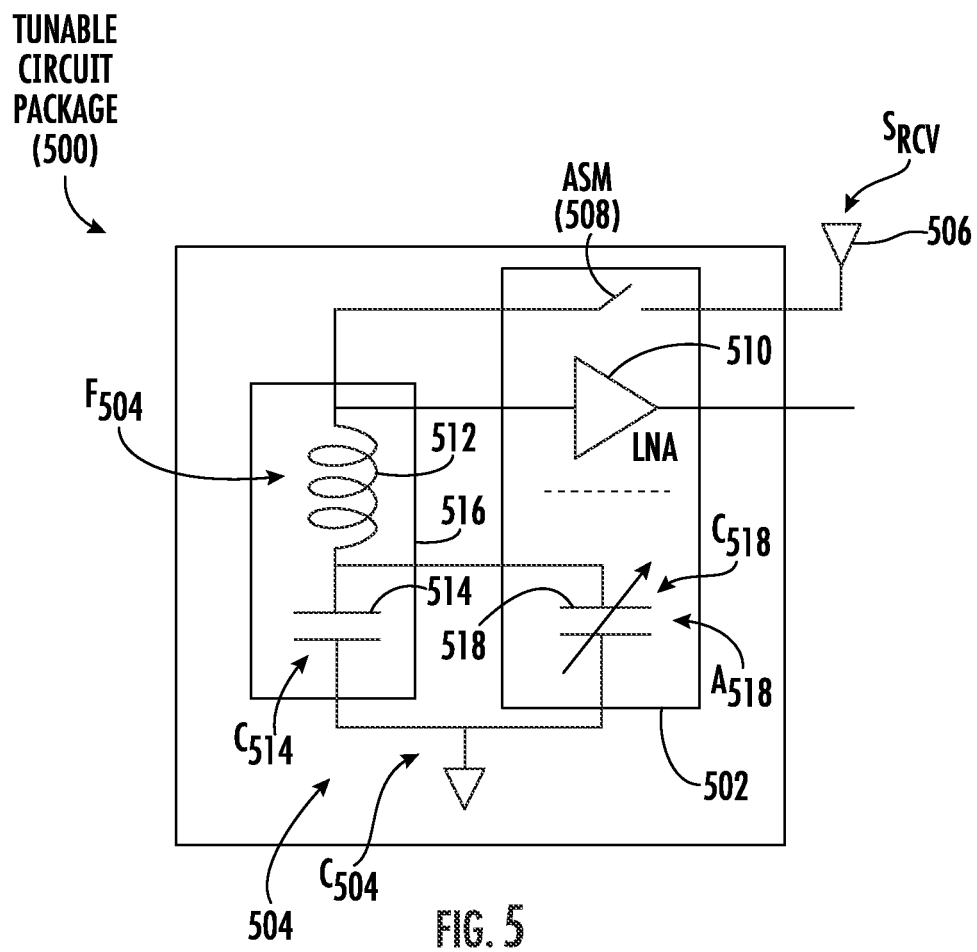
FIG. 5 is a schematic diagram of the tunable circuit of FIG. 4 in which the semiconductor device includes an antenna switch and a low-noise amplifier (LNA) coupled to the inductor in the POG device.

A schematic diagram of an exemplary tunable circuit package 500, which could be the tunable circuit package 400 in FIG. 4, is illustrated in FIG. 5. The tunable circuit package 500 is provided to illustrate a semiconductor device 502 for processing an RF signal and employing a tunable circuit 504. The tunable circuit 504 may be the tunable circuit 402 in FIG. 4. The semiconductor device 502 includes an antenna 506 for receiving a signal $S_{RCV}$. The semiconductor device 502 includes an antenna switch module (ASM) 508 coupling the antenna 506 to the tunable circuit 504 and also to a low-noise amplifier (LNA) 510. The tunable circuit 504 is tuned to a target frequency $F_{504}$ to filter, or reduce power of, signals at the frequency $F_{504}$ from the signal $S_{RCV}$. The tunable circuit 504 includes an inductor 512 and a first capacitor 514 in the passive device 516. The tunable circuit 504 also includes a variable capacitor 518 in the semiconductor device 502. The variable capacitor 518 is coupled in parallel to the first capacitor 514 and provides variability in the total capacitance $C_{504}$ in the tunable circuit 504. A maximum capacitance $C_{518}$ of the variable capacitor 518 is much smaller than a capacitance $C_{514}$ of the first capacitor 514. Thus, an area $A_{518}$ of the semiconductor device 502 occupied by the variable capacitor 518 is a small addition to the area occupied by the ASM 508 and the LNA 510, which keeps a cost of the semiconductor device 502 lower.

Figure 6:
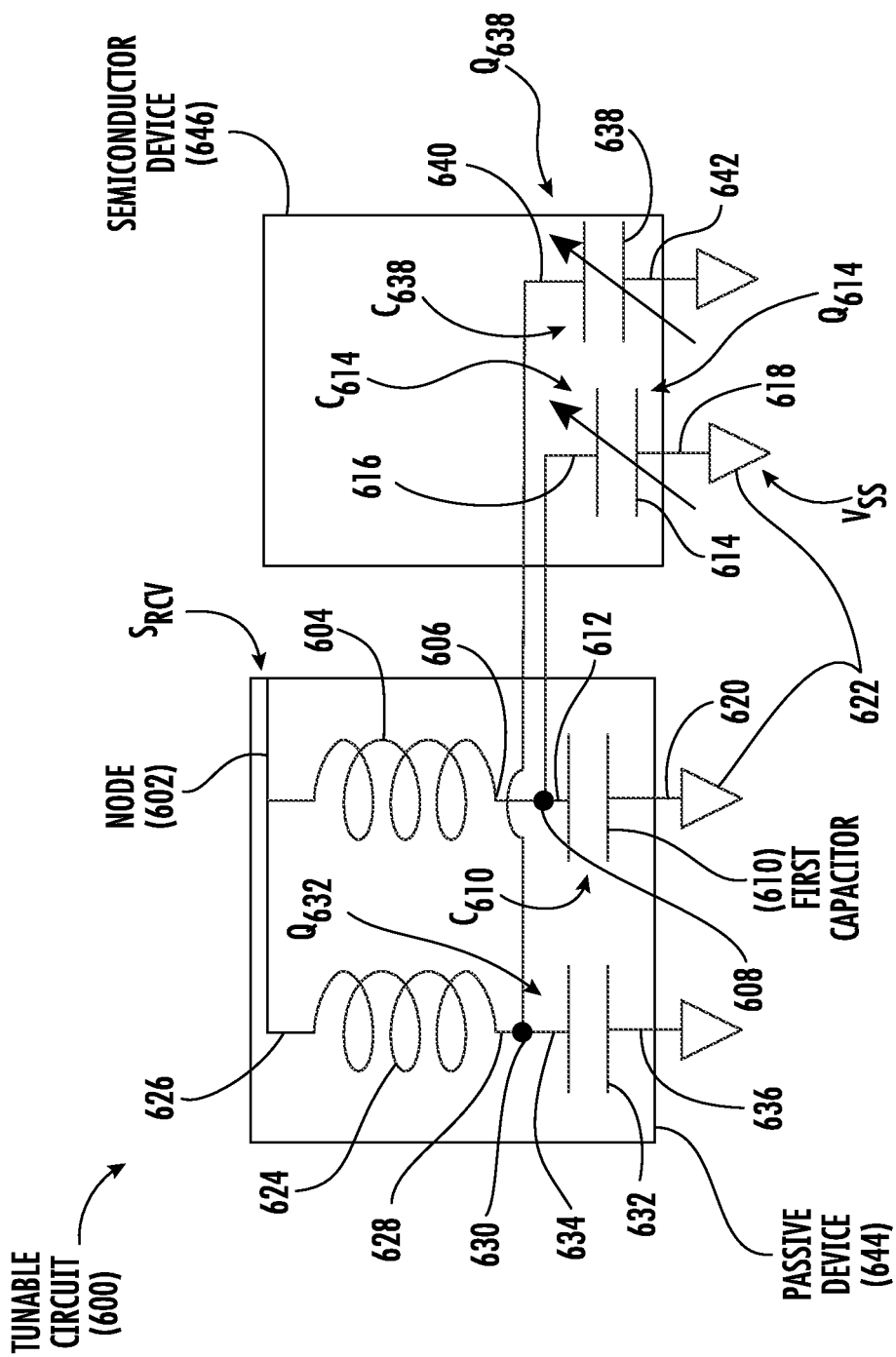
FIG. 6 is a schematic diagram of a multiple shunt circuit in which the POG device further includes a second inductor and a second capacitor coupled to a second node and the semiconductor device includes a second variable capacitor coupled to the second node, with the second capacitor and the second variable capacitor coupled in parallel to a ground voltage.

FIG. 6 is a schematic diagram provided to illustrate another example of an exemplary tunable circuit 600. The tunable circuit 600 is an example of multi-LC tank tuning. The tunable circuit 600 includes two of the tunable circuits 300 of FIG. 3 both coupled to a node 602 on which a signal $S_{RCV}$ is received from an antenna or other source. In this manner, the tunable circuit 600 provides two transmission zeros (e.g., one at each end of a useful range of communication frequencies) in a received signal. Additional transmission zeros can be provided by the multi-tank tunable circuit 600 by adding more LC tank circuits, like the tunable circuit 300 in parallel to those shown in FIG. 6.

Like the tunable circuit 300 in FIG. 3, the tunable circuit 600 includes a first inductor 604 including a first terminal 606 coupled to a node 608, a first capacitor 610 including a first terminal 612 coupled to the node 608, and a first variable capacitor 614 including a first terminal 616 coupled to the node 608. The first variable capacitor 614 and the first capacitor 610 include second terminals 618 and 620, respectively, coupled to ground nodes 622 at a ground voltage $V_{SS}$.

In addition, the tunable circuit 600 includes a second inductor 624 including a first terminal 626 coupled to first terminal 606 of the first inductor 604. The second inductor 624 also includes a second terminal 628 coupled to a second node 630. The tunable circuit 600 includes a second capacitor 632 including a first terminal 634 coupled to the second node 630 and a second terminal 636 coupled to the ground node 622. The tunable circuit 600 also includes a second variable capacitor 638 including a first terminal 640 coupled to the first terminal 606 of the second node 630 and a second terminal 642 coupled to the ground node 622.

The first and second capacitors 610 and 632 are fabricated with high Q factors $Q_{610}$ and $Q_{632}$ in a passive device 644. Due to the relatively smaller capacitances $C_{614}$ and $C_{638}$ needed for the first variable capacitor 614 and the second variable capacitor 638, the tunable circuit 600 occupies a smaller area of a semiconductor device 646. The lower Q factors $Q_{614}$ and $Q_{638}$ of the first and second variable capacitors 614 and 638 do not have a significant negative effect on performance and efficiency of the tunable circuit 600.

Figure 7:
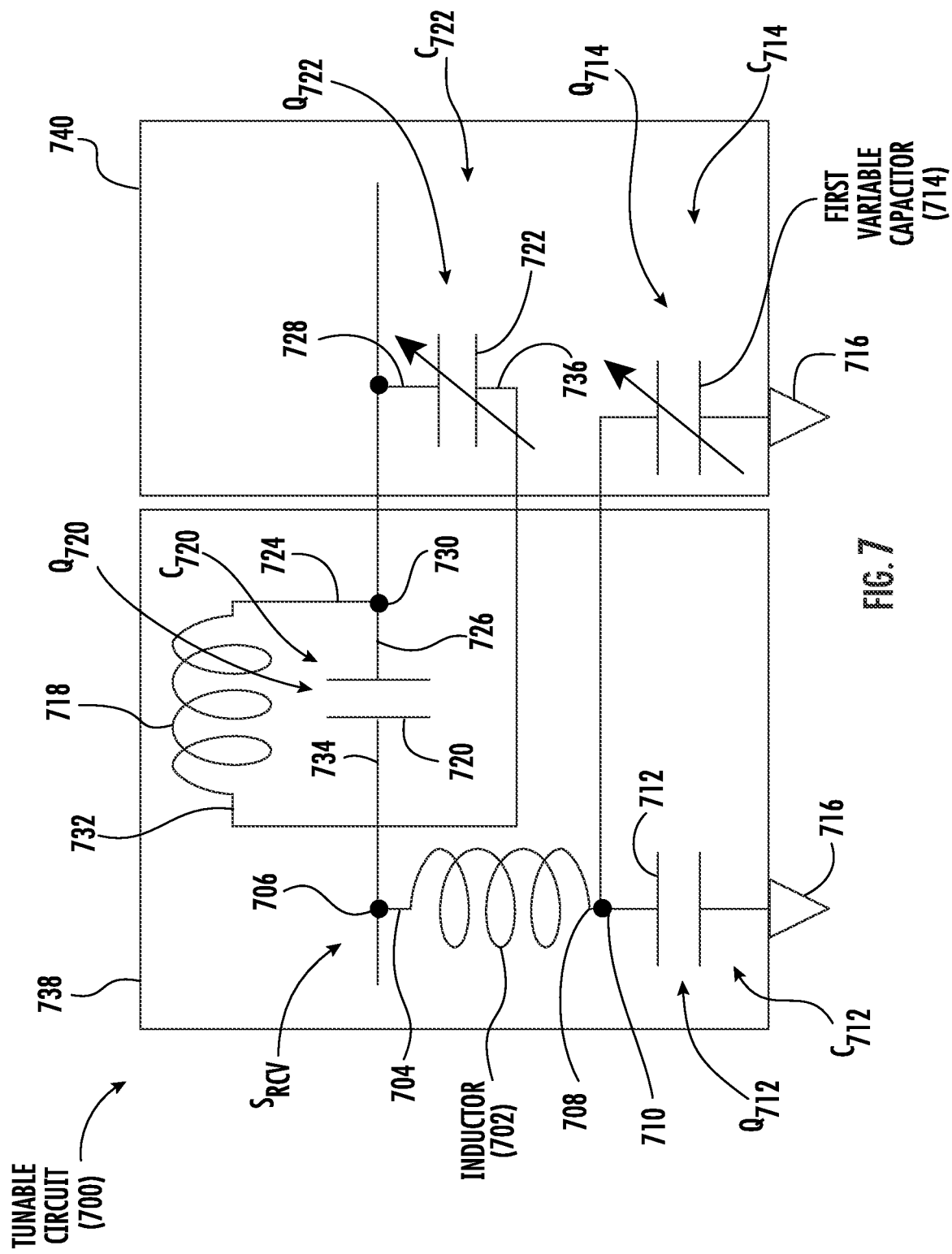
FIG. 7 is a schematic diagram of a tuning circuit including parallel and series shunt circuits.

FIG. 7 is a schematic diagram of illustrating another example of an exemplary tunable circuit 700 according to the aspects disclosed herein. The tunable circuit 700 includes both shunt and series LC tuning for filtering frequencies of a received signal $S_{RCV}$. The tunable circuit 700 includes, like the tunable circuit 300 in FIG. 3, an inductor 702 with a first terminal 704 coupled to an input node 706 and a second terminal 708 coupled to an internal circuit node 710. The tunable circuit 700 also includes a first capacitor 712 and a first variable capacitor 714 each coupled to the internal circuit node 710 and aground node 716 in a series LC shunt circuit configuration. The tunable circuit 700 includes a second inductor 718, a second capacitor 720, and a second variable capacitor 722 in a parallel LC tank circuit configuration. That is, each of the second inductor 718, the second capacitor 720, and the second variable capacitor 722 include first terminals 724, 726, and 728, respectively, coupled to a second internal circuit node 730. The second inductor 718, the second capacitor 720, and the second variable capacitor 722 also include second terminals 732, 734, and 736, respectively, coupled to the input node 706 coupled to the first terminal 704 of the inductor 702.

The first capacitor 712 and second capacitor 720 provide fixed capacitances $C_{712}$ and $C_{720}$, respectively, and are fabricated with high Q factors $Q_{712}$ and $Q_{720}$ in a passive device 738. The first variable capacitor 714 and the second variable capacitor 722 in a semiconductor device 740 provide variable capacitances $C_{714}$ and $C_{722}$, respectively.

The tunable circuit 700 differs from the tunable circuit 600 in that the second capacitor 720 and the second variable capacitor 722 are in parallel with the second inductor 718 to form an LC parallel tank circuit, whereas the second capacitor 632 and the second variable capacitor 638 in FIG. 6 are coupled in series to the second inductor 624, forming a series LC resonator or series LC tank circuit. Both types of LC resonator circuits (series and parallel) are tuned by varying a capacitance. Rather than providing all capacitance in a semiconductor-based variable capacitor (not shown) having a low Q factor, as in the semiconductor device 208 shown in FIG. 2, a majority of capacitance in the tunable circuit 700 is provided in the first and second capacitors 712 and 720 with fixed capacitances $C_{712}$ and $C_{720}$ and high Q factors $Q_{712}$ and $Q_{720}$ in the passive device 738. Thus, the first and second variable capacitors 714 and 722 in the semiconductor device 740 can be much smaller and their low Q factors $Q_{714}$ and $Q_{722}$ do not have a significant negative effect on performance and efficiency of the tunable circuit 700.

FIGS. 8-11 are schematic diagrams illustrating exemplary tunable circuits 800-1100 each including an acoustic resonator coupled in parallel to a variable capacitor. In contrast to LC resonator circuits, with a resonant frequency based on an inductance and capacitance, a resonant frequency of an acoustic resonator may additionally be based on the acoustic resonance of a piezoelectric material. The present disclosure is not limited to specific acoustic resonators. Thus, details of acoustic resonators of this type are outside the scope of this disclosure. However, as an example, a thin-film bulk acoustic resonator (not shown) can include a piezoelectric material sandwiched between metal electrodes in many different configurations. The piezoelectric material in this regard provides a dielectric layer between the metal electrodes, which also creates capacitance that contributes to determining a resonant frequency. Thus, in an exemplary aspect, a resonant frequency of an acoustic resonator may be tuned by varying a capacitance in parallel with the acoustic resonator. The tunable circuits 800-1100 are described below with reference to FIGS. 8-11.

Figure 8:
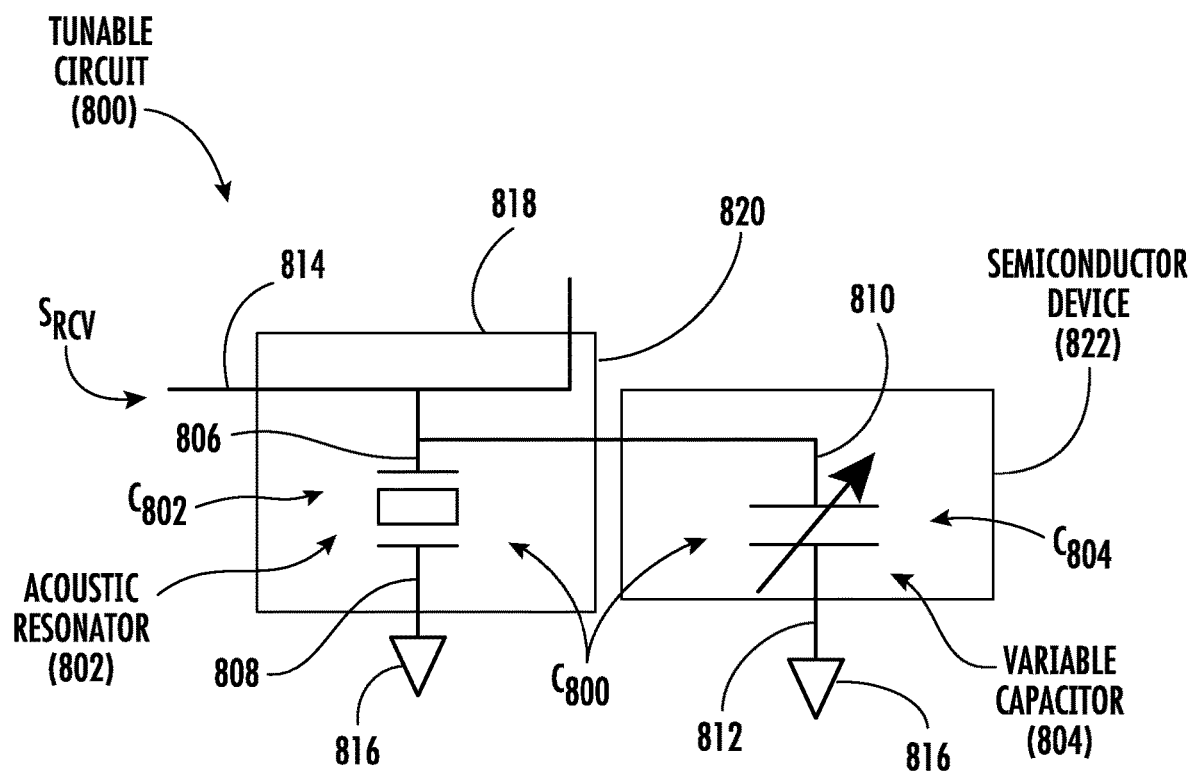
FIG. 8 is a schematic diagram of a tunable circuit including acoustic resonator and a variable circuit coupled in parallel as a shunt circuit.

FIG. 8 is a schematic diagram of the tunable circuit 800 including an acoustic resonator 802 coupled in parallel to a variable capacitor 804. The acoustic resonator 802 includes a first terminal 806 and a second terminal 808. The variable capacitor 804 includes a third terminal 810 and a fourth terminal 812. The first terminal 806 and the third terminal 810 are coupled to a signal node 814 that is supplied an RF signal $S_{RCV}$. The second terminal 808 and the fourth terminal 812 are both coupled to a ground voltage rail 816. In this regard, the tunable circuit 800 is a shunt circuit. In one example, the acoustic resonator 802 is included in a passive device 818, which can be a POG device 820, and the variable capacitor 804 is included in a semiconductor device 822. A capacitance $C_{800}$ of the tunable circuit 800 is a combination of a fixed capacitance $C_{802}$ of the acoustic resonator 802 and a variable capacitance $C_{804}$ of the variable capacitor 804.

Figure 9:
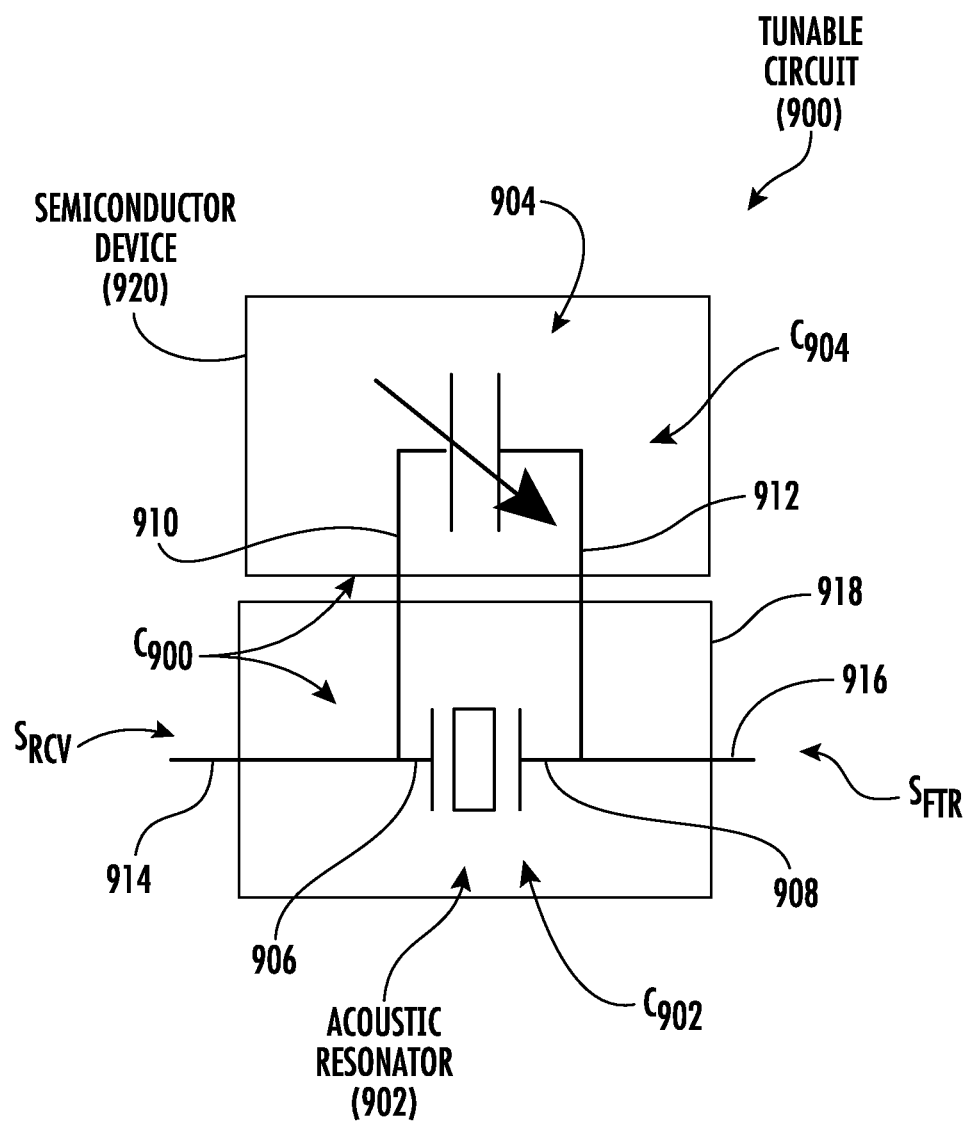
FIG. 9 is a schematic diagram of a tunable circuit including acoustic resonator and a variable circuit coupled in parallel as a series filter circuit.

FIG. 9 is a schematic diagram of the tunable circuit 900 including an acoustic resonator 902 coupled in parallel to a variable capacitor 904. The acoustic resonator 902 includes a first terminal 906 and a second terminal 908. The variable capacitor 904 includes a third terminal 910 and a fourth terminal 912. The first terminal 906 and the third terminal 910 are coupled to a signal node 914 that is supplied an RF signal $S_{RCV}$. The second terminal 908 and the fourth terminal 912 are both coupled to an output node 916 through which a filtered signal $S_{FTR}$ can be provided to processing circuits (not shown) in a mobile device, for example. In this regard, the tunable circuit 900 is a series resonator circuit. In an example, the acoustic resonator 902 is included in a passive device 918 and the variable capacitor 904 is included in a semiconductor device 920. A capacitance $C_{900}$ of the tunable circuit 900 is a combination of a fixed capacitance $C_{902}$ of the acoustic resonator 902 and a variable capacitance $C_{904}$ of the variable capacitor 904.

Figure 10:
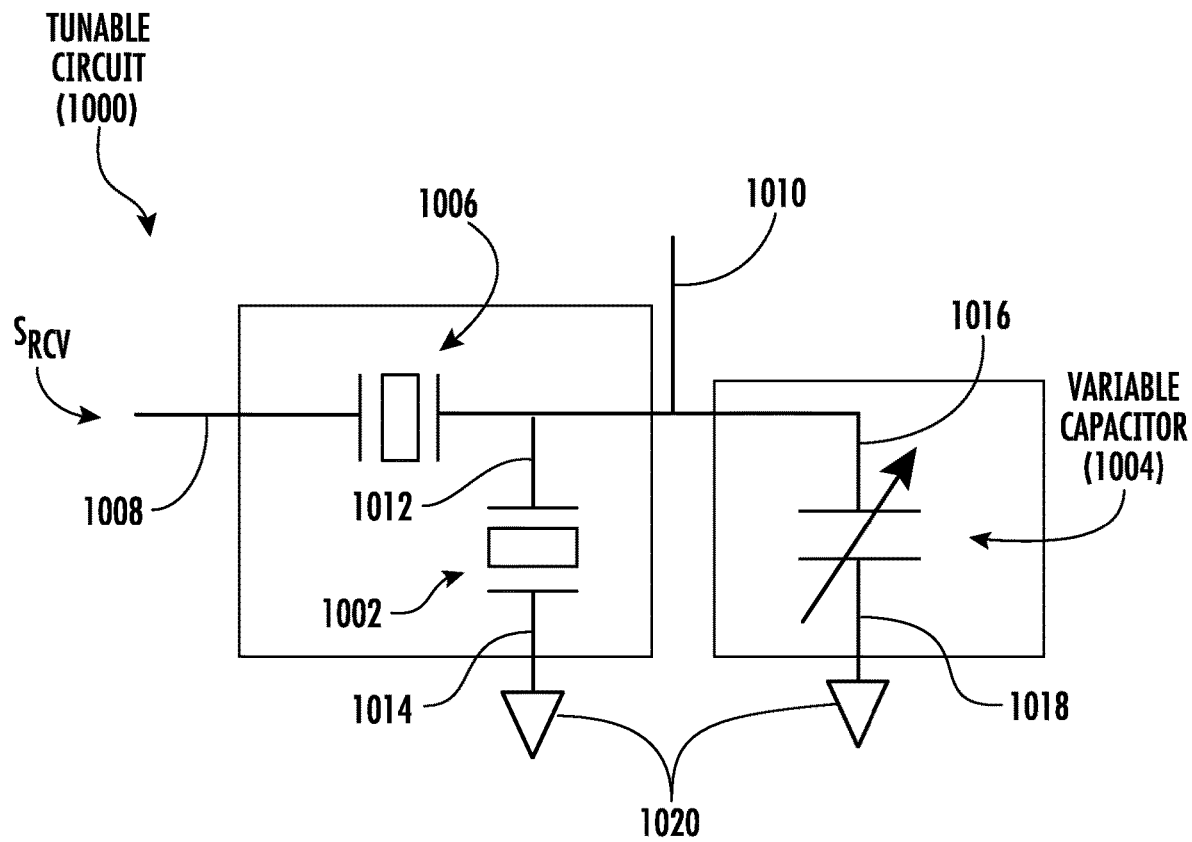
FIG. 10 is a schematic diagram of the tunable circuit in FIG. 8 including a second acoustic resonator coupled in series between a signal node and an output node.

FIG. 10 is a schematic diagram of the tunable circuit 1000 including a parallel acoustic resonator 1002 coupled in parallel to a variable capacitor 1004, similar to the tunable circuit 800 in FIG. 8. The tunable circuit 1000 also includes a series acoustic resonator 1006 coupled in series between a signal node 1008, receiving a signal (e.g., RF signal) $S_{RCV}$, and an output node 1010. The parallel acoustic resonator 1002 includes a first terminal 1012 and a second terminal 1014. The variable capacitor 1004 includes a third terminal 1016 and a fourth terminal 1018. The first terminal 1012 and the third terminal 1016 are coupled to the output node 1010. The second terminal 1014 and the fourth terminal 1018 are both coupled to a ground voltage rail 1020.

Figure 11:
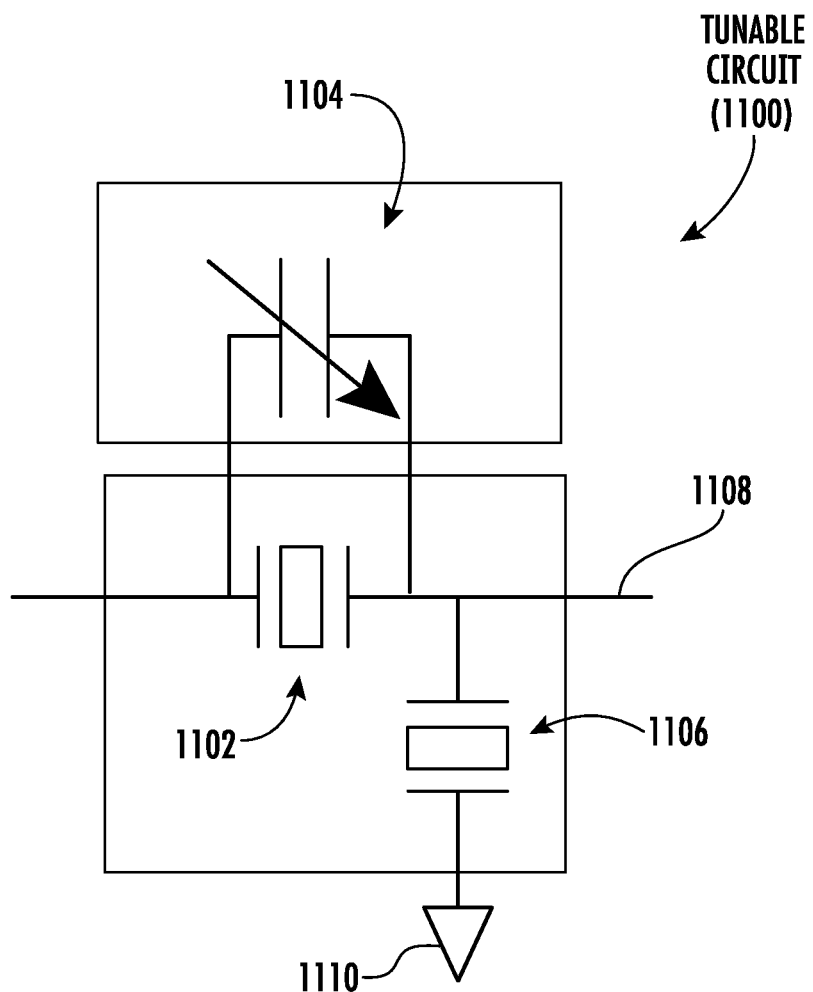
FIG. 11 is a schematic diagram of the tunable circuit in FIG. 9 including an acoustic resonator circuit coupled to an output node and a ground voltage rail.

FIG. 11 is a schematic diagram of the tunable circuit 1100 including a parallel acoustic resonator 1102 coupled in parallel to a variable capacitor 1104, similar to the tunable circuit 900 in FIG. 9. The tunable circuit 1100 also includes a shunt acoustic resonator 1106 coupled between an output node 1108 and a ground voltage rail 1110.

As noted above, the variable capacitors 804, 904, 1004 and 1104 in FIGS. 8-11 provide variable capacitance for tuning a resonant frequency of tunable circuits 800-1100. In this regard, the acoustic resonators 802, 902, 1002, and 1102 can be fabricated with high Q factors for improved performance and efficiency.

Figure 12:
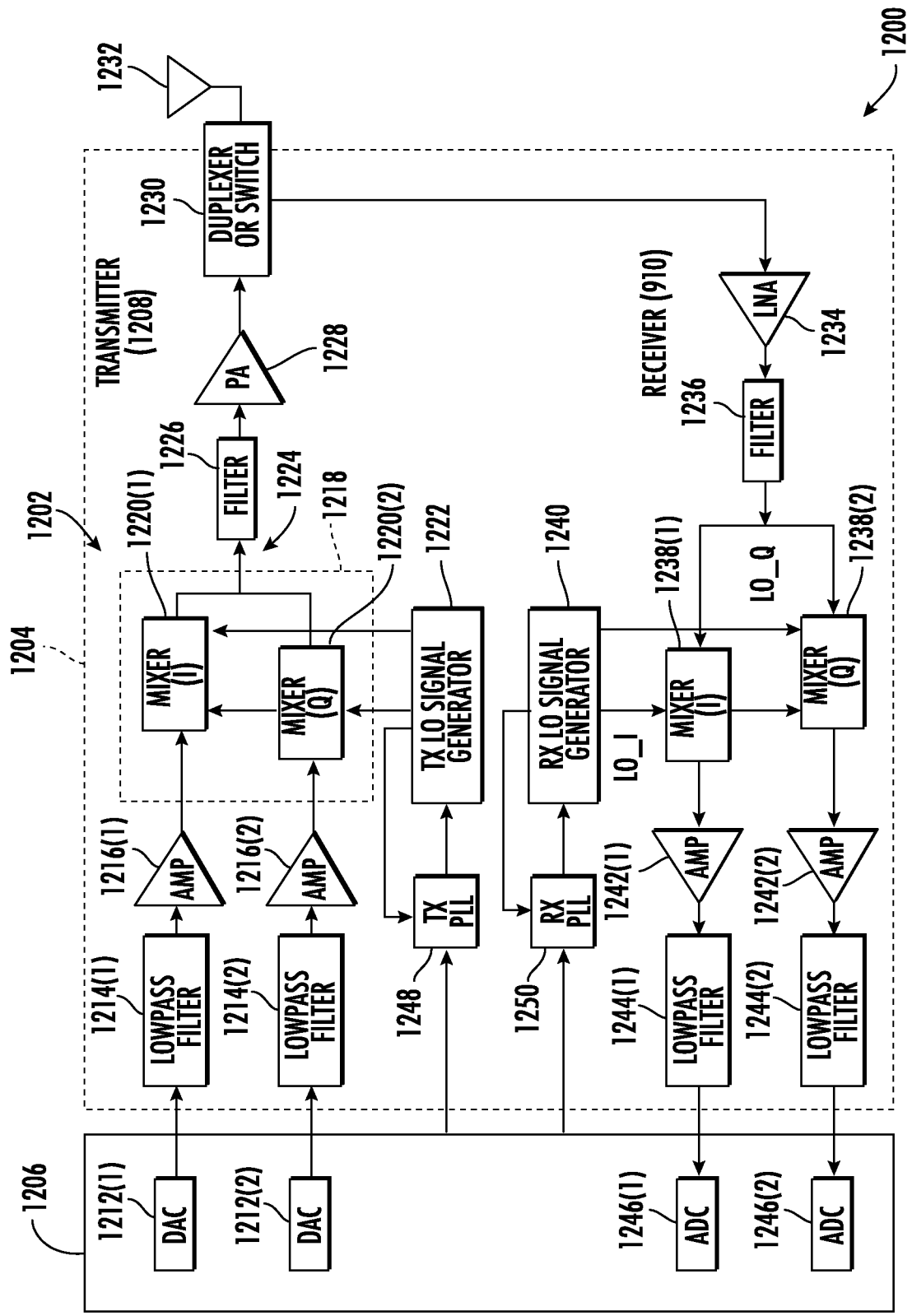
FIG. 12 is a block diagram of an exemplary wireless communications device that includes a radio frequency (RF) module including the tuning circuit in FIG. 3.

FIG. 12 illustrates an exemplary wireless communications device 1200 that includes RF components formed from one or more ICs 1202, wherein any of the ICs 1202 can include an exemplary tunable circuit including an inductor, a first capacitor, and a variable capacitor coupled to a first node in an LC circuit with the first capacitor and the variable capacitor coupled in parallel, as shown in any of FIGS. 3-11, and according to any of the aspects disclosed herein. The wireless communications device 1200 may include or be provided in any of the above-referenced devices, as examples. As shown in FIG. 12, the wireless communications device 1200 includes a transceiver 1204 and a data processor 1206. The data processor 1206 may include a memory to store data and program codes. The transceiver 1204 includes a transmitter 1208 and a receiver 1210 that support bi-directional communications. In general, the wireless communications device 1200 may include any number of transmitters 1208 and/or receivers 1210 for any number of communication systems and frequency bands. All or a portion of the transceiver 1204 may be implemented on one or more analog ICs, RFICs, mixed-signal ICs, etc.

The transmitter 1208 or the receiver 1210 may be implemented with a super-heterodyne architecture or a direct-conversion architecture. In the super-heterodyne architecture, a signal is frequency-converted between RF and baseband in multiple stages, e.g., from RF to an intermediate frequency (IF) in one stage, and then from IF to baseband in another stage. In the direct-conversion architecture, a signal is frequency-converted between RF and baseband in one stage. The super-heterodyne and direct-conversion architectures may use different circuit blocks and/or have different requirements. In the wireless communications device 1200 in FIG. 12, the transmitter 1208 and the receiver 1210 are implemented with the direct-conversion architecture.

In the transmit path, the data processor 1206 processes data to be transmitted and provides I and Q analog output signals to the transmitter 1208. In the exemplary wireless communications device 1200, the data processor 1206 includes digital-to-analog converters (DACs) 1212(1), 1212(2) for converting digital signals generated by the data processor 1206 into the I and Q analog output signals, e.g., I and Q output currents, for further processing.

Within the transmitter 1208, lowpass filters 1214(1), 1214(2) filter the I and Q analog output signals, respectively, to remove undesired signals caused by the prior digital-to-analog conversion. Amplifiers (AMPs) 1216(1), 1216(2) amplify the signals from the lowpass filters 1214(1), 1214(2), respectively, and provide I and Q baseband signals. An upconverter 1218 upconverts the I and Q baseband signals with I and Q transmit (TX) local oscillator (LO) signals from a TX LO signal generator 1222 through mixers 1220(1), 1220(2) to provide an upconverted signal 1224. A filter 1226 filters the upconverted signal 1224 to remove undesired signals caused by the frequency upconversion as well as noise in a receive frequency band. A power amplifier (PA) 1228 amplifies the upconverted signal 1224 from the filter 1226 to obtain the desired output power level and provides a transmit RF signal. The transmit RF signal is routed through a duplexer or switch 1230 and transmitted via an antenna 1232.

In the receive path, the antenna 1232 receives signals transmitted by base stations and provides a received RF signal, which is routed through the duplexer or switch 1230 and provided to a low noise amplifier (LNA) 1234. The duplexer or switch 1230 is designed to operate with a specific receive (RX)-to-TX duplexer frequency separation, such that RX signals are isolated from TX signals. The received RF signal is amplified by the LNA 1234 and filtered by a filter 1236 to obtain a desired RF input signal. Downconversion mixers 1238(1), 1238(2) mix the output of the filter 1236 with I and Q RX LO signals (i.e., LO_I and LO_Q) from an RX LO signal generator 1240 to generate I and Q baseband signals. The I and Q baseband signals are amplified by AMPs 1242(1), 1242(2) and further filtered by lowpass filters 1244(1), 1244(2) to obtain I and Q analog input signals, which are provided to the data processor 1206. In this example, the data processor 1206 includes analog-to-digital converters (ADCs) 1246(1), 1246(2) for converting the analog input signals into digital signals to be further processed by the data processor 1206.

In the wireless communications device 1200 of FIG. 12, the TX LO signal generator 1222 generates the I and Q TX LO signals used for frequency upconversion, while the RX LO signal generator 1240 generates the I and Q RX LO signals used for frequency downconversion. Each LO signal is a periodic signal with a particular fundamental frequency. A TX phase-locked loop (PLL) circuit 1248 receives timing information from the data processor 1206 and generates a control signal used to adjust the frequency and/or phase of the TX LO signals from the TX LO signal generator 1222. Similarly, an RX PLL circuit 1250 receives timing information from the data processor 1206 and generates a control signal used to adjust the frequency and/or phase of the RX LO signals from the RX LO signal generator 1240.

Wireless communications devices 1200 that each include an exemplary tunable circuit including an inductor, a first capacitor, and a variable capacitor coupled to a first node in an LC circuit with the first capacitor and the variable capacitor coupled in parallel, as shown in any of FIGS. 3-11, and according to any of the aspects disclosed herein, may be provided in or integrated into any processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopter.

In this regard, FIG. 13 illustrates an example of a processor-based system 1300 including an exemplary tunable circuit including an inductor, a first capacitor, and a variable capacitor coupled to a first node in an LC circuit with the first capacitor and the variable capacitor coupled in parallel, as shown in any of FIGS. 3-11 and according to any aspects disclosed herein. In this example, the processor-based system 1300 includes one or more central processor units (CPUs) 1302, which may also be referred to as CPU or processor cores, each including one or more processors 1304. The CPU(s) 1302 may have cache memory 1306 coupled to the processor(s) 1304 for rapid access to temporarily stored data. As an example, the processor(s) 1304 could include an exemplary tunable circuit including an inductor, a first capacitor, and a variable capacitor coupled to a first node in an LC circuit with the first capacitor and the variable capacitor coupled in parallel, as shown in any of FIGS. 3-11, and according to any aspects disclosed herein. The CPU(s) 1302 is coupled to a system bus 1308 and can intercouple master and slave devices included in the processor-based system 1300. As is well known, the CPU(s) 1302 communicates with these other devices by exchanging address, control, and data information over the system bus 1308. For example, the CPU(s) 1302 can communicate bus transaction requests to a memory controller 1310 as an example of a slave device. Although not illustrated in FIG. 13, multiple system buses 1308 could be provided, wherein each system bus 1308 constitutes a different fabric.

Other master and slave devices can be connected to the system bus 1308. As illustrated in FIG. 13, these devices can include a memory system 1312 that includes the memory controller 1310 and one or more memory arrays 1314, one or more input devices 1316, one or more output devices 1318, one or more network interface devices 1320, and one or more display controllers 1322, as examples. Each of the memory system 1312, the one or more input devices 1316, the one or more output devices 1318, the one or more network interface devices 1320, and the one or more display controllers 1322 can include an exemplary tunable circuit including an inductor, a first capacitor, and a variable capacitor coupled to a first node in an LC circuit with the first capacitor and the variable capacitor coupled in parallel, as shown in any of FIGS. 3-11, and according to any of the aspects disclosed herein. The input device(s) 1316 can include any type of input device, including, but not limited to, input keys, switches, voice processors, etc. The output device(s) 1318 can include any type of output device, including, but not limited to, audio, video, other visual indicators, etc. The network interface device(s) 1320 can be any device configured to allow exchange of data to and from a network 1324. The network 1324 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 1320 can be configured to support any type of communications protocol desired.

The CPU(s) 1302 may also be configured to access the display controller(s) 1322 over the system bus 1308 to control information sent to one or more displays 1326. The display controller(s) 1322 sends information to the display(s) 1326 to be displayed via one or more video processors 1328, which process the information to be displayed into a format suitable for the display(s) 1326. The display(s) 1326 can include any type of display, including, but not limited to, a cathode ray tube (CRT), a liquid crystal display (LCD), a plasma display, a light emitting diode (LED) display, etc. The display controller(s) 1322, display(s) 1326, and/or the video processor(s) 1328 can include an exemplary tunable circuit including an inductor, a first capacitor, and a variable capacitor coupled to a first node in an LC circuit with the first capacitor and the variable capacitor coupled in parallel, as shown in any of FIGS. 3-11, and according to any of the aspects disclosed herein.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. The master and slave devices described herein may be employed in any circuit, hardware component, IC, or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations. Thus, the disclosure is not intended to be limited to the examples and designs described herein but is to be accorded the widest scope consistent with the principles and novel features disclosed herein.

Implementation examples are described in the following numbered clauses:

1. A tunable circuit, comprising:
    an inductor comprising a first terminal and a second terminal, the first terminal coupled to a node;
    a first capacitor comprising a third terminal and a fourth terminal, the third terminal coupled to the node; and
    a variable capacitor comprising a fifth terminal and a sixth terminal, the fifth terminal coupled to the node.
2. The tunable circuit of clause 1, wherein:
    the fourth terminal of the first capacitor and the sixth terminal of the variable capacitor are configured to couple to a ground node at a ground voltage.
3. The tunable circuit of clause 2, further comprising:
    a second inductor comprising a seventh terminal and an eighth terminal, the seventh terminal coupled to the first terminal and the eighth terminal coupled to a second node;
    a second capacitor comprising a ninth terminal and a tenth terminal, the ninth terminal coupled to the second node and the tenth terminal coupled to the ground node; and
    a second variable capacitor comprising an eleventh terminal and a twelfth terminal, the eleventh terminal coupled to the second node and the twelfth terminal coupled to the ground node.
4. The tunable circuit of clause 1, wherein:
    the fourth terminal of the first capacitor and the sixth terminal of the variable capacitor are coupled to the second terminal of the inductor.
5. The tunable circuit of any of clause 1 to clause 4, further comprising:
    a passive device comprising the inductor and the first capacitor; and
    a semiconductor device comprising the variable capacitor.
6. The tunable circuit of clause 5, further comprising a package substrate, wherein the passive device and the semiconductor device are coupled to the package substrate.
7. The tunable circuit of clause 5, wherein the passive device further comprises a glass substrate.
8. The tunable circuit of clause 7, wherein the passive device further comprises copper conductive elements of the inductor and the first capacitor.
9. The tunable circuit of any of clause 1 to clause 8, wherein:
    the first capacitor comprises a fixed capacitance; and
    the variable capacitor comprises a variable capacitance configured to tune a resonant frequency of the tunable circuit.
10. The tunable circuit of clause 9, wherein:
    the variable capacitance is in a range from a minimum capacitance to a maximum capacitance; and
    the maximum capacitance is less than 100 percent of the fixed capacitance.

11. The tunable circuit of any of clause 1 to clause 10 integrated into a radio frequency (RF) front end module.

12. The tunable circuit of any of clause 1 to clause 11 integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

13. A tunable circuit, comprising:
a first acoustic resonator comprising a first terminal and a second terminal, the first terminal coupled to a first node configured to receive an input signal; and
a variable capacitor comprising a third terminal coupled to the first terminal and a fourth terminal coupled to the second terminal.

14. The tunable circuit of clause 13, further comprising:
a passive device comprising the first acoustic resonator; and
a semiconductor device comprising the variable capacitor.

15. The tunable circuit of clause 13 or clause 14, wherein:
the second terminal and the fourth terminal are coupled to a ground voltage rail.

16. The tunable circuit of clause 15, further comprising:
a second acoustic resonator coupled between an input node and the first node.

17. The tunable circuit of clause 13, wherein:
the second terminal and the fourth terminal are coupled to an output node configured to generate an output signal.

18. The tunable circuit of clause 17, further comprising:
a second acoustic resonator coupled between the output node and a ground voltage rail.

19. A tunable circuit package, comprising:
a package substrate;
a passive device coupled to the package substrate, the passive device comprising:
an inductor comprising a first terminal and a second terminal, the first terminal coupled to a node;
a first capacitor comprising a third terminal and a fourth terminal, the third terminal coupled to the node; and
a semiconductor device coupled to the package substrate, the semiconductor device comprising a variable capacitor comprising a fifth terminal and a sixth terminal, the fifth terminal coupled to the node.

20. The tunable circuit package of clause 19, wherein the passive device further comprises a passive-on-glass (POG) device.

21. The tunable circuit package of clause 19 or clause 20, wherein the semiconductor device further comprises a low noise amplifier (LNA) circuit.

22. The tunable circuit package of any of clause 19 to clause 21, wherein the semiconductor device further comprises an antenna switch module (ASM) coupled to the first terminal of the inductor and the ASM is configured to couple to an antenna.

23. The tunable circuit package of clause 22, wherein:
the antenna is configured to receive a signal comprising a range of frequencies; and
the tunable circuit package is configured to reduce or prevent transmission of at least one frequency of the signal.

24. A method of manufacturing a tunable circuit package, comprising: forming a package substrate;
forming a passive device comprising an inductor and a first capacitor, the inductor comprising a first terminal and a second terminal, the first terminal coupled to a node, and the first capacitor comprising a third terminal and a fourth terminal, the third terminal coupled to the node;
forming a semiconductor device comprising a variable capacitor comprising a fifth terminal and a sixth terminal;
coupling the passive device to the package substrate; and
coupling the semiconductor device to the package substrate to couple the fifth terminal to the node.

What is claimed is:

1. A tunable circuit package, comprising:
a package substrate;
a passive device coupled to the package substrate, the passive device comprising:
an inductor comprising a first terminal and a second terminal, the first terminal coupled to a node; and
a first capacitor comprising a third terminal and a fourth terminal, the third terminal coupled to the node;
a semiconductor device coupled to the package substrate, the semiconductor device comprising a variable capacitor comprising a fifth terminal and a sixth terminal, the fifth terminal coupled to the node; and
wherein the package substrate comprises at least one metal layer coupled to the first terminal of the inductor and to the fifth terminal of the variable capacitor.

2. The tunable circuit package of claim 1, wherein the passive device further comprises a passive-on-glass (POG) device.

3. The tunable circuit package of claim 1, wherein the semiconductor device further comprises a low noise amplifier (LNA) circuit.

4. The tunable circuit package of claim 1, wherein the semiconductor device further comprises an antenna switch module (ASM) coupled to the first terminal of the inductor and the ASM is configured to couple to an antenna.

5. The tunable circuit package of claim 4, wherein:
the antenna is configured to receive a signal comprising a range of frequencies; and
the tunable circuit package is configured to reduce or prevent transmission of at least one frequency of the signal.

6. A tunable circuit package, comprising:
a first substrate comprising a first material;
an inductor comprising:
at least one first metal layer in the first substrate; and
a first terminal;
a first capacitor comprising:
at least one second metal layer in the first substrate; and
a second terminal coupled to the first terminal of the inductor;
a second substrate comprising a semiconductor material different than the first material of the first substrate;
a variable capacitor disposed in the second substrate, the variable capacitor comprising a third terminal coupled to the first terminal of the inductor; and
a package substrate comprising at least one metal layer coupled to the first terminal of the inductor and to the third terminal of the variable capacitor.

7. The tunable circuit package of claim 6, wherein:
the package substrate comprises a first surface;
the first substrate is disposed on the first surface; and
the second substrate is disposed on the first surface.

8. The tunable circuit package of claim 6, wherein the first material of the first substrate comprises glass.

9. The tunable circuit package of claim 6, wherein the variable capacitor comprises a varactor.

10. The tunable circuit package of claim 6, wherein the variable capacitor comprises a plurality of switched capacitors, each switched capacitor comprising:
a switch; and
a second capacitor.

11. The tunable circuit of claim 6 integrated into a radio frequency (RF) front end module.

12. The tunable circuit of claim 6 integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

13. The tunable circuit package of claim 6, further comprising a first acoustic resonator, comprising:
the inductor;
the first capacitor; and
a piezoelectric material disposed on the first substrate.

14. The tunable circuit package of claim 13, further comprising:
a second acoustic resonator disposed on the first substrate, the second acoustic resonator comprising:
the piezoelectric material disposed on the first substrate; and
a fourth terminal coupled to the first terminal of the inductor.

15. The tunable circuit package of claim 14, wherein:
the first acoustic resonator comprises a fifth terminal; and
the second acoustic resonator further comprises a sixth terminal coupled to the fifth terminal of the first acoustic resonator.

16. A method of manufacturing a tunable circuit package, comprising:
forming a first substrate comprising a first material;
forming an inductor comprising:
at least one first metal layer in the first substrate; and
a first terminal;
forming a first capacitor comprising:
at least one second metal layer in the first substrate; and
a second terminal coupled to the first terminal of the inductor;
forming a second substrate comprising a semiconductor material different than the first material of the first substrate;
forming a variable capacitor disposed in the second substrate, the variable capacitor comprising a third terminal coupled to the first terminal of the inductor; and
forming a package substrate comprising at least one metal layer coupled to the first terminal of the inductor and to the third terminal of the variable capacitor.

17. The method of claim 16, further comprising:
disposing the first substrate on a first surface of the package substrate; and
disposing the second substrate on the first surface of the package substrate.

18. The method of claim 16, wherein forming the first substrate comprising the first material further comprises forming a glass substrate.

* * * * *